(12) United States Patent
Koski et al.

(10) Patent No.: US 12,313,663 B2
(45) Date of Patent: May 27, 2025

(54) METHOD AND APPARATUS FOR DETERMINING GATE CAPACITANCE

(71) Applicant: Microsoft Technology Licensing, LLC, Redmond, WA (US)

(72) Inventors: Jonne Verneri Koski, The Hague (NL); Filip Kazimierz Malinowski, Delft (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 273 days.

(21) Appl. No.: 17/996,442

(22) PCT Filed: Apr. 29, 2020

(86) PCT No.: PCT/EP2020/061956
§ 371 (c)(1),
(2) Date: Oct. 18, 2022

(87) PCT Pub. No.: WO2021/219219
PCT Pub. Date: Nov. 4, 2021

(65) Prior Publication Data
US 2023/0204642 A1 Jun. 29, 2023

(51) Int. Cl.
*G01R 27/26* (2006.01)
*G01R 23/02* (2006.01)
*G01R 31/26* (2020.01)

(52) U.S. Cl.
CPC ......... *G01R 27/2605* (2013.01); *G01R 23/02* (2013.01); *G01R 31/2621* (2013.01); *G01R 31/2625* (2013.01)

(58) Field of Classification Search
CPC ............... G01R 27/2605; G01R 23/02; G01R 31/2621; G01R 31/2625
See application file for complete search history.

(56) References Cited

U.S. PATENT DOCUMENTS 3,970,925 A 7/1976 Procter et al.
9,995,778 B1 * 6/2018 Fiori, Jr. ............ G01R 27/2611
(Continued)

FOREIGN PATENT DOCUMENTS

DE  102005055954 A1  5/2007
JP  H11326424 A  11/1999
(Continued)

OTHER PUBLICATIONS

Petersson, et al., "Circuit Quantum Electrodynamics with a Spin Qubit", In Journal of Nature, vol. 490, Issue 7420, Oct. 18, 2012, pp. 380-383.
(Continued)

*Primary Examiner* — Amy He
(74) *Attorney, Agent, or Firm* — Alleman Hall & Tuttle LLP (57) ABSTRACT

Provided is a method of determining a gate capacitance of a semiconductor device having a source, a drain, a gate, and a channel, the semiconductor device being arranged in a circuit further comprising an electrical resonator, wherein one of the source, the drain, and the gate is connected to the electrical resonator. The method comprises: measuring a resonance frequency of the circuit; and calculating, based on the resonance frequency, the gate capacitance. Since it is not necessary to pass a current through the semiconductor device, an accurate measurement of gate capacitance may be achieved. Also provided are an apparatus for determining a gate capacitance, a probe for measuring gate capacitance, and a related computer program product.

18 Claims, 5 Drawing Sheets

(56) References Cited

U.S. PATENT DOCUMENTS

| | | | | |
|---|---|---|---|---|
| 10,284,154 | B1* | 5/2019 | Schoessow | H01J 49/022 |
| 2005/0088186 | A1 | 4/2005 | Maciejewski et al. | |
| 2005/0225333 | A1* | 10/2005 | Talanov | G01R 27/2676 |
| | | | | 324/663 |
| 2009/0102504 | A1* | 4/2009 | Voigtlaender | G01R 31/2621 |
| | | | | 324/762.09 |

FOREIGN PATENT DOCUMENTS

| | | |
|---|---|---|
| JP | 2017090266 A | 5/2017 |
| WO | 2019001753 A1 | 1/2019 |
| WO | 2021093977 A1 | 5/2021 |

OTHER PUBLICATIONS

"Electron Mobility", Retrieved From: https://en.wikipedia.org/wiki/Electron_mobility#Field-effect_mobility, Retrieved On: Apr. 22, 2020, 13 Pages.

"LC Circuit", Retrieved From: https://en.wikipedia.org/wiki/LC_circuit, Mar. 24, 2020, 8 Pages.

"Mechanical Probe Station", Retrieved From: https://en.wikipedia.org/wiki/Mechanical_probe_station, Retrieved On: Apr. 2, 2020, 2 Pages.

"Probe Tips—Micromanipulator", Retrieved From: https://www.micromanipulator.com/category/accessories/probe-tips/, Retrieved On: Apr. 2, 2020, 9 pages.

"MPI RF Probes", Retrieved From: https://www.mpi-corporation.com/ast/mpi-rf-probes-accessories/, Retrieved On: Apr. 2, 2020, 8 Pages.

"R&S® ZNB Vector Network Analyzer", Retrieved From: https://www.rohde-schwarz.com/nl/product/znb-productstartpage_63493-11648.html, Retrieved On: Apr. 22, 2020, 2 Pages.

"Provisional Application Filed in U.S. Appl. No. 62/885,715", filed Aug. 12, 2019, 28 Pages.

Ciccarelli, et al., "Impedance of the Single-Electron Transistor at Radio-frequencies", In New Journal of Physics, vol. 13, Issue 9, Aug. 17, 2011, 11 Pages.

Clement, et al., "Evaluation of a Gate Capacitance in the Sub-aF Range for a Chemical Field-Effect Transistor With a Silicon Nanowire Channel", In IEEE Transactions on Nanotechnology, vol. 10, Issue 5, Sep. 2011, 8 Pages.

Colless, et al., "Dispersive Readout of a Few-Electron Double Quantum Dot with Fast rf Gate Sensors", In Journal of Physical Review Letters, vol. 110, Issue 4, Jan. 25, 2013, 5 Pages.

Halliday, et al., "Fundamentals of Physics, 7th Extended Edition", Published by John Wiley & Sons, Aug. 2013, 4 Pages.

Krizek, et al., "Field Effect Enhancement in Buffered Quantum Nanowire Networks", In Repository of arXiv:1802.07808v2, Apr. 5, 2018, 15 Pages.

Tapson, et al., "Improved Capacitance Measurement by Means of Resonance Locking", In Journal of Measurement Science and Technology, vol. 5, Issue 1, Oct. 25, 1993, 8 Pages.

"International Search Report and Written Opinion Issued in PCT Application No. PCT/EP2020/061956", Mailed Date: Jan. 11, 2021, 15 Pages.

Lan, et al., "Method to Determine Forward Gate Capacitance of HFETs Using Resonance Effect", In IEEE Electronic Letter, vol. 32, Issue 6, Mar. 14, 1996, pp. 596-597.

* cited by examiner

METHOD AND APPARATUS FOR DETERMINING GATE CAPACITANCE

CROSS REFERENCE TO RELATED APPLICATIONS

The present application is a U.S. National Phase of International Patent Application Serial No. PCT/EP2020/061956 entitled "METHOD AND APPARATUS FOR DETERMINING GATE CAPACITANCE", filed Apr. 29, 2020.

BACKGROUND

Various types of semiconductor devices include a gate. A gate is an electrode which is configured to apply an electrostatic field to a portion of semiconductor material, which portion may be referred to as a channel. The electrostatic field may vary the number of available charge carriers in the semiconductor material, thereby allowing control over the electrical properties of the semiconductor material.

It is typically desirable to minimise any flow of current between the gate to the semiconductor material. Any such current is referred to as leakage current. To this end, the gate is separated from the semiconductor material by a dielectric. The dielectric may include an air gap, or a layer of material.

Charge in the gate is separated from charge in the semiconductor material by the dielectric. This means that the gate structure has a capacitance, which is referred to as a gate capacitance. Measurements of gate capacitance may provide useful information about the electronic behaviour of the device, the properties of the semiconductor material, the properties of the dielectric material, etc.

An existing method for determining gate capacitance is referred to as the capacitance-voltage, or C-V, method. This method involves applying AC currents directly to the semiconductor component. A limitation of this method is that the signal obtained can be noisy.

One class of semiconductor device which is of particular research interest is semiconductor-superconductor hybrid devices. These devices are useful for quantum computing. In a hybrid device, energy level hybridisation, also referred to as coupling, between a semiconductor and a superconductor may occur under certain conditions. Excitations which are useful for quantum computing, for example Majorana zero modes, may be induced in such a device. Inducing such excitations may involve applying a magnetic field to the device, as well as electrostatically gating one or more portions of the device. The structure and fabrication of one example hybrid device are disclosed in WO 2019/001753 A1.

SUMMARY

One aspect provides a method of determining a gate capacitance of a semiconductor device having a source, a drain, a gate, and a channel, the semiconductor device being arranged in a circuit further comprising an electrical resonator, wherein one of the source, the gate, and the drain is connected to the electrical resonator; the method comprising: measuring a resonance frequency of the circuit; and calculating, based on the resonance frequency, the gate capacitance.

Another aspect provides an apparatus for determining a gate capacitance of a semiconductor device, the semiconductor device having a having a source, a drain, a gate, and a channel; the apparatus comprising: a signal generator capable of providing a probe signal to an electrical resonator; a sensor capable of sensing at least one of the amplitude and the phase of a response signal from the electrical resonator; a processing unit operably linked to the signal generator and the sensor; and a memory unit operably linked to the processing unit, wherein the memory unit stores computer program code, the computer program code being executable by the processing unit; wherein the computer program code comprises: a control module for causing the processing unit to control the signal generator; an identification module for causing the processing unit to identify, based on an input from the sensor, a resonance frequency of a circuit comprising the electrical resonator; a calculation module for causing the processing unit to calculate, based on the resonance frequency, the gate capacitance of the semiconductor device; and an output generation module for generating an output identifying the gate capacitance.

A still further aspect provides a probe for measuring gate capacitance, comprising a needle probe, an inductor, and a capacitor; wherein the needle probe, inductor and capacitor are configured as an LC circuit; and wherein the probe is configured to be connectable to an apparatus to receive a probe signal from the apparatus and to provide a response signal from the LC circuit to the apparatus.

Another aspect provides a computer program product embodied on a non-transitory computer readable medium, comprising computer program code which, when executed by a processor, causes the processor to: process an input to identify a resonance frequency of a circuit comprising an electrical resonator; calculate, based on the resonance frequency, a gate capacitance; and generate an output identifying the gate capacitance.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which.

DETAILED DESCRIPTION

As used herein, the verb 'to comprise' is used as shorthand for 'to include or to consist of'. In other words, although the verb 'to comprise' is intended to be an open term, the replacement of this term with the closed term 'to consist of' is explicitly contemplated.

In the context of the present disclosure, a signal is an electrical signal having a frequency, a phase, and an amplitude.

Described herein is a method of determining a gate capacitance of a semiconductor device, such as a semiconductor-superconductor hybrid device. The method makes use of an electrical resonator. The resonator is connected to the device under investigation. This causes a change in the resonance frequency of the resonator. The gate capacitance of the device may be calculated from the resonance frequency of the device-resonator system. The method may, for example, allow measurements of gate capacitance with a better signal-to-noise ratio than existing methods.

Figure 1:
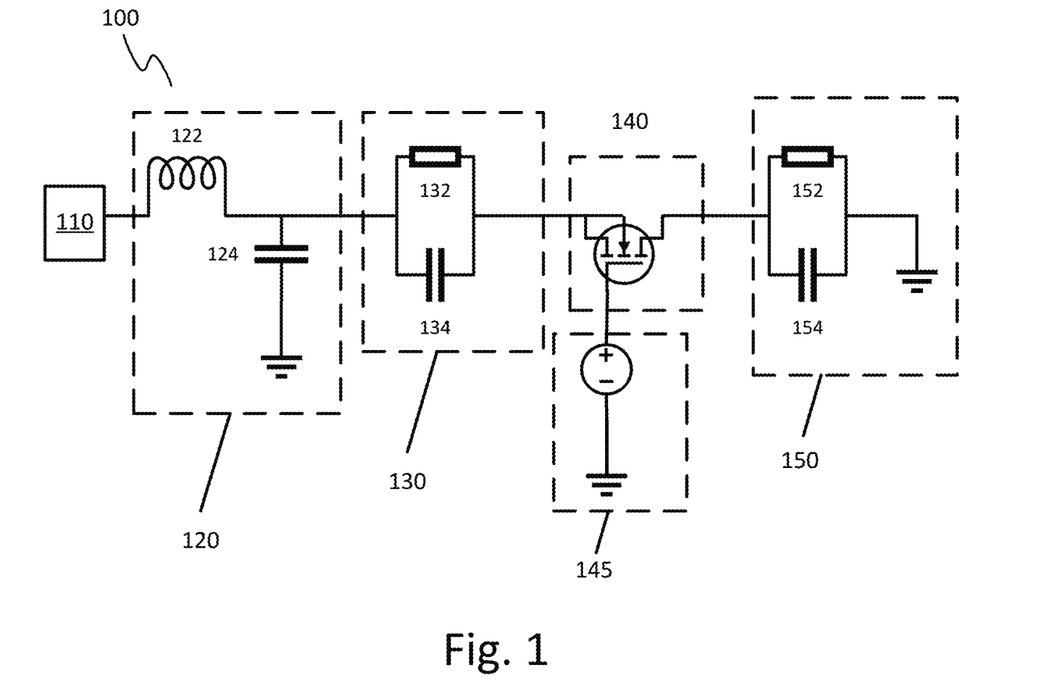
FIG. 1 is a diagram of a first example of a circuit for measuring gate capacitance, the circuit including an LC resonator.
Figure 2:
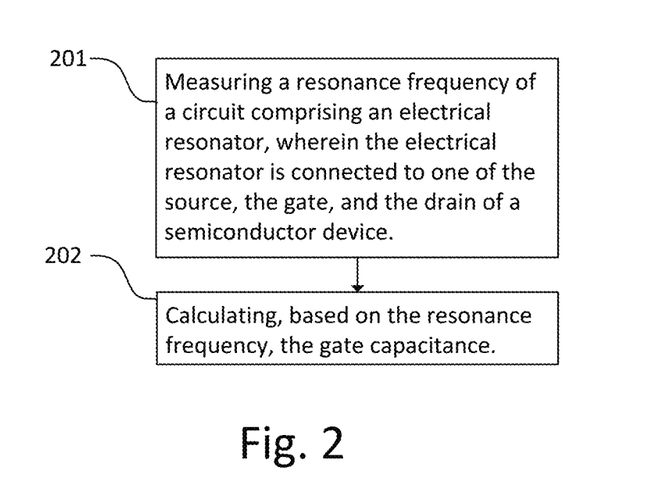
FIG. 2 is a flow chart outlining a method of measuring gate capacitance.

The principles of the method will now be explained with reference to FIGS. 1 and 2. FIG. 1 is a diagram of an example circuit useful for practising the method, and FIG. 2 is a flowchart outlining the method.

The illustrated circuit 100 allows for measurement of the resonance frequency of a system made up of an electrical resonator unit 120 and a semiconductor device 140. Semiconductor device 140 in this example is a transistor. A transistor has a source terminal which is connected to a drain terminal by a portion of semiconductor material. The portion of semiconductor material is referred to as a channel. The transistor further includes a gate electrode for applying an electrostatic field to the channel in order to modify the number of available charge carriers in the channel.

Although the illustrated example shows a transistor, the method provided herein may be applied to any type of semiconductor device which includes a source, a drain, a channel, and a gate. For example, a semiconductor-superconductor hybrid device may include a semiconductor component in the form of a nanowire; an electrical contact at each end of the nanowire; one or more gate electrodes for applying an electrostatic field to one or more portions of the nanowire; and a superconductor component configured to be capable of undergoing energy level hybridisation with the semiconductor. In such a structure, the electrical contacts represent a source and a drain, and the one or more portions of the nanowire represent a channel.

Semiconductor device 140 is depicted as an N-type MOSFET. This is one illustrative example of a semiconductor device in which the density of charge carriers in the channel can be varied by applying a gate voltage. Any other gated semiconductor device may be investigated using the present methods.

The source of semiconductor device 140 is connected to one end of an electrical resonator unit 120 via a low impedance contact 130. The drain of semiconductor device 140 is connected to a high impedance contact 140. The gate of semiconductor device 140 is connected to a voltage source 145 for applying an electrostatic field to the gate electrode.

In this example, electrical resonator unit 120 is an LC circuit. An LC circuit comprises an inductor 122, coupled to a capacitance, represented by capacitor component 124. An LC circuit is one example of an electrical resonator.

Although FIG. 1 shows a capacitor component 124, the capacitance may be parasitic. Parasitic capacitance, also referred to as stray capacitance, is a capacitance that unavoidably arises from the physical proximity of components of a circuit.

In most implementations, an LC circuit includes an inductor component such as a coil. Although any conductor through which a current flows will give rise to a parasitic inductance, in practice parasitic inductances are usually very small.

In implementations when an LC circuit is used, the LC circuit may have a natural resonance frequency in the range 10 MHz to 2 GHZ, optionally 30 MHz to 1.5 GHZ. By "natural resonance frequency" is meant the frequency of the LC circuit alone, when not connected to a gate capacitance. As will be explained in more detail below, the resonance frequency of an LC circuit may be varied by selecting the magnitudes of the inductance and the capacitance.

For example, the inductor may have an inductance in the range 100 nH to 5 pH. The capacitance may have a magnitude in the range 0.1 pF to 5 pF. One example implementation, which provides a resonance frequency of approximately 1.5 GHZ, uses an inductance of 100 nH and a capacitance of 0.1 pF. Another example implementation, which provides a resonance frequency of approximately 30 MHZ, uses an inductance of 5 pH and a capacitance of 5 pF.

In implementations where the capacitance is a parasitic capacitance, the magnitude of the inductance may be selected to provide a desired resonance frequency.

The properties of the electrical resonator may be selected to optimize the sensitivity of the measurement. For example, the impedance of the electrical resonator may be matched with the impedance of a transmission line between the IO unit and the electrical resonator may allow for improved sensitivity. Another possibility is to select the quality factor of the resonant circuit based on the resistivity of the semiconductor device.

In implementations where a capacitor component is present, the capacitor may be a varactor. The capacitance of a varactor may be varied by applying an electrostatic field to the varactor. Varying the capacitance varies the natural resonance frequency of the LC circuit. A resonator which has a variable resonance frequency is referred to as tuneable.

Alternatively, a tuneable LC circuit may in principle be implemented using a variable inductor and a fixed capacitance. A still further possible implementation comprises a variable inductor and a variable capacitor.

The connection between the electrical resonator unit 120 and the source of semiconductor device 140 is a low impedance contact 130. In FIG. 1, the low impedance contact 130 is illustrated by resistor 132 and capacitor 134. Any connector or transmission line will have an intrinsic impedance, and resistor 132 and capacitor 134 represent this intrinsic impedance. The impedance of low impedance contact 130 is desirably as low as possible. The low impedance contact typically does not comprise a resistor component or a capacitor component.

High impedance contact 150, which is connected to the drain of the semiconductor device 140, is illustrated by a resistor 152 and capacitor 154. It is desirable for current flow through the semiconductor device from the source to the drain to be as low as possible, ideally 0. It is also desirable for any capacitance at the drain contact to be minimised.

The high impedance contact is selected to have an impedance which is large compared to the impedance of the gate capacitance. The high impedance contact 150 may comprise a tunnel junction. Alternatively, the high impedance contact 150 may comprise a resistor, for example a resistor having a resistance of at least 2 MΩ, optionally at least 10 MΩ. Capacitor 154 represents a parasitic capacitance. The parasitic capacitance of the high impedance contact is desirably as low as possible.

Alternatively, the drain of the semiconductor device 140 may be connected to a transistor, for example a field effect transistor. In an "off" state, the transistor may behave as a high impedance contact to allow for measurement of gate capacitance. In an "on" state, the transistor may allow current to flow from the source to the drain of the semiconductor device 140, allowing for measurement of conductance of the channel of the semiconductor device.

Electrical resonator unit 120 and semiconductor device 140 may be connected permanently. For example, the electrical resonator unit and the semiconductor device may be fabricated on the same chip or may be soldered into the same circuit. Alternatively, the electrical resonator unit and semiconductor device 140 may be removably connected. Electrical resonator unit 120 may be implemented as a needle probe, temporarily touched on a terminal of the semiconductor device, as explained in more detail below with reference to FIG. 5. The terminal may be one of the source, the gate, and the drain.

The circuit 100 further comprises an input-output, IO, unit 110. IO unit 110 is connected to the electrical resonator unit 120. IO unit 110 is configured to send a probe signal, in the form of an AC current having a frequency and a phase, to the electrical resonator unit 120. The probe signal generated by the IO unit may have a frequency in the range 10 MHz to 10 GHZ, for example.

The IO unit 110 may be configured to allow the frequency of the probe signal to be varied. This may allow the input frequency to be scanned to facilitate detection of the resonance frequency of the electrical resonator unit 120.

In implementations where the circuit includes a tuneable electrical resonator unit, an IO unit 110 which provides a probe signal having a fixed frequency may be used. In such implementations, the tuning of the electrical resonator unit may be varied to obtain resonance, and Cgate may be inferred based on the variation of the tuning.

In implementations where the phase of the response signal relative to the probe signal is measured, the IO unit 110 may provide a probe signal having a fixed frequency.

IO unit 110 is further configured to detect a response signal from the electrical resonator unit 120. More specifically, the IO unit 110 is configured to detect the amplitude of the response signal and/or phase of the response signal. In particular, the IO unit may be configured to detect a phase difference between the response signal and the response signal. An example of a detector useful for detecting the response signal is a vector network analyser. Vector network analysers are commercially available, one example being the R&S® ZNB Vector Network Analyzer commercialized by Rohde & Schwarz. A vector network analyser may detect both phase and amplitude. Measuring both phase and amplitude may allow for more accurate determination of the resonance frequency.

In the example circuit, electrical resonator unit 120 is connected to the source of the semiconductor device 140. The electrical resonator unit 120 may alternatively be connected to either the drain or the gate of the semiconductor device 140. In other words, the electrical resonator unit connects to the IO unit and any one of the source, the drain, and the gate.

In variants where the electrical resonator unit 120 is connected to the drain, the source may be connected to the high impedance contact.

In variants where the electrical resonator unit 120 is connected to the gate, a gate voltage may be applied via the resonator or via a further gate. Semiconductor devices are typically configured to prevent flow of current from the gate electrode to the source and drain, e.g., with a gate dielectric between the gate and the channel. In other words, the direct connection between the gate and the source and drain is usually highly resistive. The gate dielectric may act as the high impedance contact.

The operation of circuit 100 will now be described with reference to FIG. 2.

At block 201, the resonance frequency of the electrical resonator is measured. Various approaches to the measurement of resonance frequency are possible.

When the frequency of the probe signal generated by the IO unit 110 is close to the resonance frequency of electrical resonator unit 120, the amplitude and phase of the response signal received from the electrical resonator unit 120 change. The change in amplitude of the response signal and/or the change in phase of the response signal are detected by the IO unit 110.

The resonance frequency may be identified by monitoring the response signal received by the IO unit 110 whilst varying the frequency of the probe signal generated by the IO unit. Alternatively or additionally, in implementations where the electrical resonator unit 120 is tuneable, the tuning of the electrical resonator unit may be varied. Measurements which include varying frequency of the probe signal and/or the tuning of the electrical resonator unit may allow for accurate determination of the resonance frequency.

Another approach to measuring resonance frequency is to measure a difference in phase between the response signal and the probe signal, and to calculate the resonance frequency based on the difference in phase. The difference in phase is related to the difference between the frequency of the probe signal and the resonance frequency of the electrical resonator (see e.g. Halliday et al, Fundamentals of Physics, 7th extended International edition. Wiley, 2005, ISBN 0-471-2321-9, pages 844-845). Resonance frequency may therefore be calculated from the phase difference. This approach may allow the use of a probe signal having a fixed frequency and an electrical resonator unit having a fixed tuning. This may in turn allow for the resonance frequency to be determined rapidly.

In some implementations, these two approaches may be combined. A first measurement of resonance frequency may be performed by measuring a difference in phase between the response signal and the probe signal, the probe signal having a fixed frequency. A first estimate of the resonance frequency may be calculated based on the difference in phase. A second measurement of resonance frequency may then be performed by scanning a range of probe signal frequencies whilst measuring the amplitude and/or phase of the response signal, to obtain the second measurement. The width of the range and/or a starting frequency for the scanning may be selected based on the first measurement. This may allow for a narrower range to be scanned.

At block 202, the gate capacitance is calculated based on the resonance frequency. The calculation may be performed by executing computer program code as described herein below using a processing unit. The processing unit may cause the calculated resonance frequency value to be stored in working memory, written to data storage, and/or displayed to a user. Example calculations will be explained with reference to an LC circuit.

An LC circuit has a resonance frequency which depends upon the magnitude of the capacitance and the inductance in the circuit. The resonance frequency may be calculated using Formula 1:

$$f = \frac{1}{2\pi\sqrt{LC}}$$

where f is the resonance frequency in Hz, L is the inductance in Henry (kg·m2·s−2·A−2), and C is the capacitance in Farad (s4·A2·m−2·kg−1).

As may be understood from the above formula, electrical resonator unit 120 has a resonance frequency determined by the magnitudes of the inductance 122 and capacitance 124.

In the circuit 100, electrical resonator unit 120 is coupled to the semiconductor device 140 via low impedance contact 130. The semiconductor device 140 has a gate capacitance. The gate capacitance influences the resonance frequency of the LC circuit. The resonance frequency of this coupled system is described by Formula 2:

$$f = \frac{1}{2\pi\sqrt{L(C_{res} + C_{gate})}}$$

where f is the resonance frequency of the system in Hz, L is the inductance in Henry, Cres is represents the capacitance of the LC circuit in Farad, and Cgate is the gate capacitance of the semiconductor device in Farad.

The gate capacitance of the semiconductor device may thus be calculated based on the resonance frequency of the circuit 100.

Any contribution of the semiconductor device to the inductance is assumed to be 0. Current through the semiconductor component 140, and thus any contribution to the inductance of the system, is negligible because semiconductor component 140 is coupled to high-impedance contact 150.

The resistance and inductance of the low impedance contact 130 are desirably as small as possible. Preferably, the resistance of the low impedance contact obeys the relationship:

$$R_{contact} << 2\pi f\, C_{gate}$$

where Rcontact is the resistance of the low impedance contact, f is the resonance frequency of the electrical resonator, and Cgate is the gate capacitance.

The capacitance of the low impedance contact, Ccontact, may obey the relationship:

$$C_{contact} > C_{gate}$$

This may contribute to providing a small impedance, Zcontact, since the impedance may be described by:

$$Z_{contact} = \frac{1}{2\pi i f C_{contact}}$$

where i is $\sqrt{-1}$.

The low impedance contact may comprise a transmission line. The low impedance contact may include a capacitor. Alternatively, the capacitance of the low impedance contact may be a parasitic capacitance.

Any effect of the low impedance contact on the resonance frequency of the system may be taken into account by calibration, as discussed below.

One technique for calibrating the circuit 100 is to perform measurements at different applied gate voltages. The gate capacitance of a semiconductor device varies depending upon the gate voltage.

Relative gate capacitances may be determined by measuring the resonance frequency at two or more different gate voltages.

To allow for calculation of absolute gate capacitance, a measurement may be performed at a gate voltage selected such that the channel of the semiconductor component is fully depleted. When the channel is fully depleted, Cgate may be assumed to be zero.

The gate voltage which fully depletes the channel may be determined based on conductance measurements. Alternatively, resonance frequency may be measured as a function of gate voltage. The maximum resonance frequency will correspond to the minimum total capacitance, coinciding with Cgate=0.

In implementations where the electrical resonator unit 120 is removably connected to the semiconductor device 140, a still further possibility is to calibrate the circuit by measuring the resonance frequency of the electrical resonator unit 120 before connecting the electrical resonator unit 120 to the semiconductor device 140. This may introduce a systematic error, because any parasitic capacitance of the connection between the resonator unit 120 and semiconductor device 140 is not taken into account.

A useful property of LC circuits is that the resonance frequency of the system responds linearly to changes in gate capacitance to a first approximation. This may be understood from a Taylor expansion of Formula 2 about point C=Cres, shown below as Formula 3:

$$f = \frac{1}{2\pi\sqrt{LC_{res}}} - \frac{1}{4\pi\sqrt{L}\, C_{res}^{\frac{3}{2}}} \times C_{gate}$$

L and Cres are constants, therefore this formula is of the form:

$$f = A - B \times C_{gate}$$

A linear response to changes in a value of interest is a desirable property of a measurement system.

Measuring the gate capacitance may provide insights into the performance of the device and/or the materials used to construct the device. For example, measurements of gate capacitances at a plurality of different gate voltages may allow the response of the device to changes in gate voltage to be characterised.

Gate capacitance measurements may be used in combination with conductance measurements to investigate charge mobility, in particular, field effect mobility, in a device. This may be of particular interest for devices for use in quantum computing, such as semiconductor-superconductor hybrid devices. The method may include measuring gate capacitance at a predetermined gate voltage, and measuring conductance at the predetermined gate voltage.

The performance of a gate dielectric may be investigated by applying a varying gate voltage and measuring gate capacitance as a function of time. Charge trapping by the gate dielectric, for example, may cause the response to the gate voltage to vary.

The example of FIGS. 1 and 2 uses an LC circuit as the electrical resonator. However, other types of electrical resonator may be used. An example circuit 300 which uses a transmission line resonator as the electrical resonator unit is shown in FIG. 3.

Figure 3:
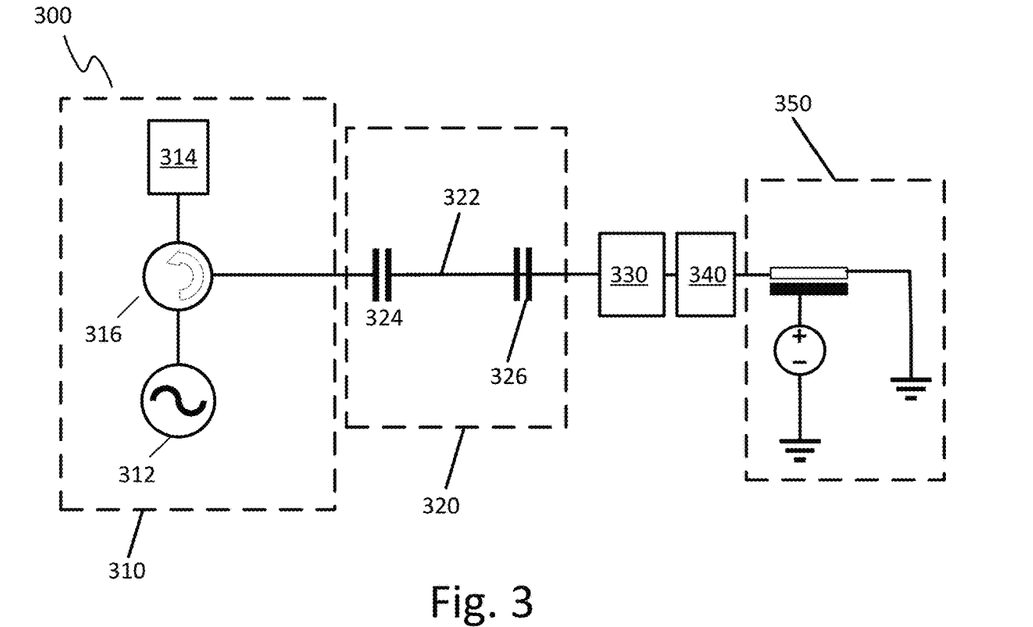
FIG. 3 is a diagram of a second example of a circuit for measuring gate capacitance, the circuit including a transmission line resonator.

The circuit 300 of FIG. 3 differs from circuit 100 of FIG. 1 in that the electrical resonator unit 320 is a transmission line resonator. The circuit 300 further differs from circuit 100 in that high impedance contact 150 is replaced by a switchable contact 350. In addition, FIG. 3 shows further details of an illustrative IO unit 310. Circuit 300 is otherwise the same as circuit 100. The low impedance contact 330, semiconductor device and associated gate 340 are shown in simplified form.

The transmission line resonator 320 of this example comprises a transmission line 322 which extends between two capacitors 324 and 326. The capacitors 324, 326 may be implemented in the form of breaks in a transmission line. Each break may have a width in the range 1 μm to 100 μm. An electrical signal supplied to the transmission line resonator is partially reflected by the capacitors 324, 326. At resonance, a standing wave is formed along the transmission line 322. The length of the transmission line 322 determine the resonance frequency of the resonator 320.

The transmission line resonator may have a resonance frequency in the range 1 to 10 GHz, for example.

The switchable contact 350 of circuit 300 comprises a transistor and a bias source for gating the transistor. The source of the transistor is connected to the drain of semiconductor device 340 under investigation. The drain of the transistor is connected to ground. Gating the transistor off (or 'closed') causes the transistor to act as a high impedance contact similar to high impedance contact 150 of circuit 100, allowing for measurement of gate capacitance. Gating the transistor on (or 'open') allows current to flow through the transistor. This may be useful in, for example, the measurement of conductance. Providing a switchable contact may allow a single circuit to be used in measurements of both gate capacitance and conductance.

A switchable contact may be paired with any type of resonator. For example, circuit 100 could be modified by replacing high impedance contact 150 with a switchable contact.

Measurement of gate capacitance using circuit 300 uses the principles explained with reference to circuit 100. As with circuit 100, connecting the resonator 320 to a semiconductor component 330 having a gate capacitance causes a shift in the resonance frequency of the resonant circuit 320 which varies depending on the applied gate voltage. One of skill in the art will be able to adapt the equations described with reference to the LC circuit of FIG. 1 to other types of electrical resonator, such as transmission line resonator 320.

Measuring conductance comprises switching the switchable contact to a low impedance state, applying a voltage to the semiconductor device, and measuring current through the circuit. In examples where the electrical resonator unit is connected to the source of the semiconductor device as illustrated in FIG. 3, the voltage may be applied through the electrical resonator 320, since electrical resonators typically have very little impact on conductance.

In a variant, the IO unit and electrical resonator unit may be connected to the gate. In such a variant, switchable contact(s) may be connected to the source and/or the drain of the semiconductor device.

IO unit 310 of this example comprises a signal generator 312, a detector 314, and a circulator 316. The signal generator 312 may be, for example, a microwave generator. The signal generator 312 communicates with a first terminal of the circulator 316. The electrical resonator unit 320 communicates with a second terminal of the circulator 316. The detector 314 communicates with a third terminal of the circulator 316.

Various alternative implementations of IO units are possible. The form of the IO unit is not particularly limited, provided that a probe signal can be sent to the electrical resonator unit, and a response signal can be received from the electrical resonator unit.

In implementations where the resonator is an LC resonator, a coupling capacitor may be included between the IO unit and the electrical resonator unit. A coupling capacitor may be useful for combining a DC signal with a radio-frequency excitation, or to adjust the strength of electrical coupling between the resonator and IO unit. In implementations which use a transmission line resonator, capacitor 324 may act as a coupling capacitor.

In use, a probe signal from the signal generator 312 is sent to the resonator unit 320 via the circulator 316, and a response signal received from the resonator unit 320 is passed to the detector 314 via the circulator 316.

Figure 4:
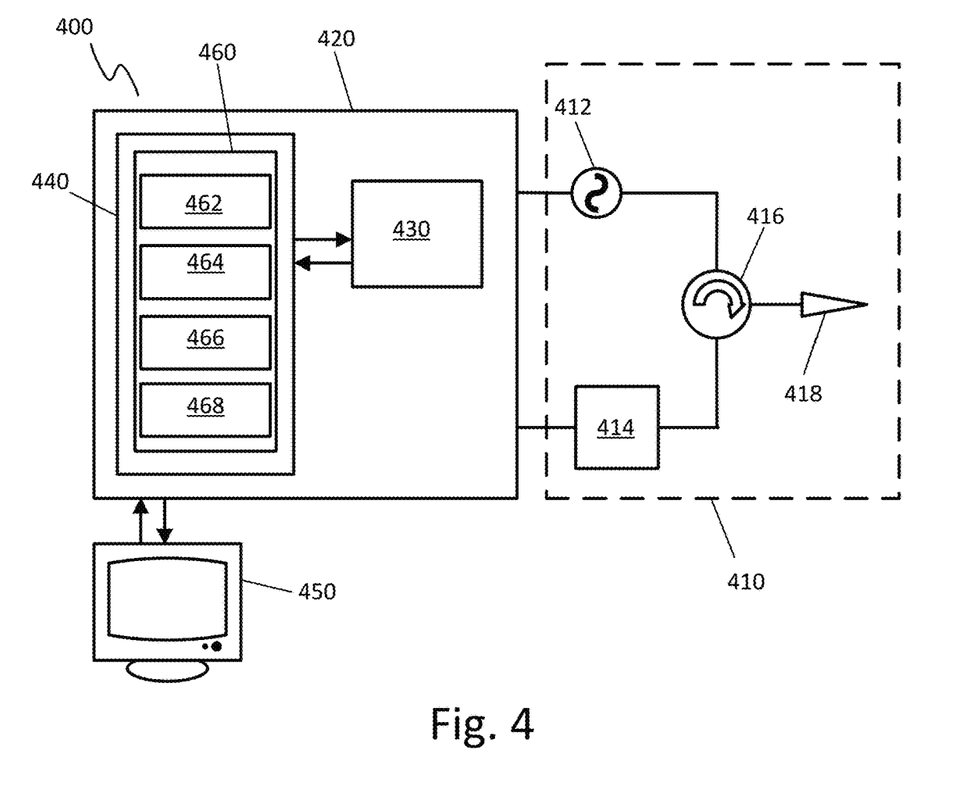
FIG. 4 is a schematic diagram of an apparatus for measuring gate capacitance.

An example of an apparatus 400 according to the present disclosure will now be described with reference to FIG. 4.

The apparatus 400 includes an IO unit 410 and a computer 420 for controlling the IO unit 410. The computer 420 is operably linked to an optional user terminal 450. The apparatus 400 may be in the form of a mechanical probe station, for example.

The IO unit 410 comprises a signal generator 412, a sensor 414, a circulator 416, and a connector 418.

The signal generator 412 may comprise a microwave generator. In use, the signal generator generates a probe signal which is sent to an electrical resonator via connector 418.

The control may include activating and deactivating the signal generator. The control may include varying the frequency of the signal generated by the signal generator. The signal generator may be, for example, a microwave generator.

IO unit 410 further includes a sensor 414. Sensor 414 is for receiving a response signal from a resonator. Sensor 414 may be configured to measure amplitude and/or phase of the response signal. Sensor 414 may comprise, for example, a vector network analyser. Sensor 414 may be configured to send computer-readable data representing the response signal to the computer 420, for example via analogue-to-digital convertor circuitry.

Circulator 416 allows signal generator 412 and sensor 414 to be connected to a single terminal of an electrical resonator via connector 418. Connector 418 may take any appropriate form. For example, connector 418 may comprise a needle probe, such as needle probe 500 discussed below with reference to FIG. 5.

The apparatus 400 may further comprise the electrical resonator. Alternatively, the apparatus may be connectable to an external resonator.

The computer 420 includes a processing unit 430 which is operably linked to a data storage 440. The data storage 440 stores a computer program 460 for execution by the processing unit.

The user terminal 450 may include user input equipment and a display device.

The user input equipment may comprise any one or more suitable input devices for known in the art for receiving inputs from a user. Examples of input devices include a pointing device, such as a mouse, stylus, touchscreen, trackpad and/or trackball. Other examples of input devices include a keyboard, a microphone when used with voice recognition algorithm, and/or a video camera when used with a gesture recognition algorithm.

Where reference is made herein to receiving an input from the user through the user input equipment, this may mean through any one or more user input devices making up the user input equipment.

The user input equipment may be useful for allowing a user to initiate execution of the computer program 460, and/or for allowing the user to define operating parameters for the apparatus 400. For example, the user input equipment may allow the user to input a desired frequency range to be scanned by the signal generator 410. In implementations where the apparatus 400 is configured to control the gate voltage of the semiconductor device, the user input equipment may allow the user to specify one or more gate voltages. In implementations where the apparatus is connectable to an external resonator, the user input apparatus may allow the user to input descriptors of the external resonator such as the type of resonator, electrical parameters of the resonator, etc.

The display device may take any suitable form for outputting images, such as a light emitting diode (LED) screen, liquid crystal display (LCD), plasma screen, or cathode ray tube (CRT). The display device may comprise a touchscreen, and thus also form at least part of the user input equipment. A touchscreen may enable inputs by via being touched by the user's finger and/or using a stylus.

The inclusion of a display device is optional. A display device is useful in implementations where it is desired to provide a graphical output to a human user, such as a graph or text. As described below, the computer program used in the present context may generate other forms of output, such as storing data in data storage 440.

The processing unit 430 may include one or more processors implemented in one or more dies, IC (integrated circuit) packages and/or housings at one or more geographic sites.

Each of the one or more processors may take any suitable form known in the art, e.g. a general-purpose central processing unit (CPU), or a dedicated form of co-processor or accelerator processor such as a graphics processing unit (GPU), digital signal processor (DSP), etc. Each of the one or more processors may comprise one or more cores.

Where it is said that a computer program is executed by the processing unit, this may mean execution by any one or more processors making up the processing unit 430.

The processing unit 430 typically further comprises working memory, such as random-access memory and/or one or more memory caches within the one or more processors.

The data storage 440 comprises one or more memory units implemented in one or more memory media in one or more housings at one or more geographic sites.

Each of the one or more memory units may employ any suitable storage medium known in the art, e.g. a magnetic storage medium such as a hard disk drive (HDD), magnetic tape drive etc.; or an electronic storage medium such as a solid state drive (SSD), flash memory or electrically erasable programmable read-only memory (EEPROM), etc.; or an optical storage medium such as an optical disk drive or glass or memory crystal based storage, etc.

Where it is said herein that some item of data is stored in data storage 460 or a region thereof, this may mean stored in any part of any one or more memory units making up the data storage 460.

The processing unit 430 and data storage 440 are operably linked. The processing unit and data storage are configured such that processing apparatus 210 is capable of reading data from at least a portion of data storage 440, and writing data to at least a portion of the data storage 440. The processing unit 430 may communicate with the data storage 440 over a local connection, e.g. a physical data bus and/or via a network such as a local area network or the Internet. In the latter case the network connections may be wired or wireless.

The data storage 440 stores computer program code 460, i.e. software, which is executable by the processing unit 130. Executing the computer program code 460 may cause the apparatus 420 to perform steps of a method of measuring a gate capacitance as provided herein.

Functionality of the computer program code 460 will be described with reference to various modules. As used herein, the term "module" is used for convenience of description to refer to any portion of computer program code configured to perform the described operation. The computer program code may be implemented in any appropriate manner. The operations of one or more modules may be combined as appropriate.

Computer program code 460 includes a control module 462 for causing the processing unit to control the signal generator; an identification module 464 for causing the processing unit to identify, based on an input from the sensor, a value of the resonance frequency of the electrical resonator; a calculation module 466 for causing the processing unit to determine, based on the resonance frequency, a value of the gate capacitance of the semiconductor device; and an output generation module 468 for generating an output identifying the value of the gate capacitance.

The control module 462 may cause the processing unit 430 to activate the signal generator and to identify the frequency of the signal generated by the signal generator.

In implementations where the signal generator is capable of variable frequency signal generation, the control module may cause the signal generator to perform a scan of a frequency range. The frequency range may be a range specified by a user, e.g., input via user input equipment of the user terminal 450; a predetermined frequency range; or a programmatically-determined frequency range.

A predetermined frequency range may be the full dynamic range of the signal generator.

The frequency range may be selected programmatically based on one or more descriptors of the resonator and/or semiconductor device. The descriptors may include one or more of an estimated inductance of the resonator, an estimated capacitance of the resonator, and a predicted gate capacitance for the semiconductor device. The computer program code may include a simulation module for predicting the gate capacitance of the semiconductor device based on e.g. the dimensions and/or materials of the device. Limiting the range of the scan based on such descriptors may allow the resonance frequency to be identified more quickly.

The frequency range may be selected programmatically by calculating an estimated resonance frequency based on a difference in phase between the probe signal and the response signal at a predetermined probe signal frequency; and selecting a range spanning intervals on either side of the estimated resonance frequency. For example, a range spanning the estimated resonance frequency±a defined tolerance may be selected.

In implementations where the electrical resonator is a tuneable electrical resonator, such as an LC circuit including a varactor, control module 462 may cause the signal generator to operate at a fixed frequency. Control module 462 may tune the electrical resonator, e.g. by controlling the output of a variable voltage source operably linked to a varactor component of the electrical resonator.

Control module 462 may record the value of the frequency. Recording may comprise writing data to the data storage and/or holding data in the working memory of the data processing unit, as appropriate.

The computer program code 460 further comprises an identification module 464 for causing the processing unit to identify, based on an input from the sensor 414, a resonance frequency of the electrical resonator. As previously described with reference to FIG. 1, the strength of the response signal from the electrical resonator increases when the frequency of the probe signal matches the resonance frequency of the electrical resonator. By monitoring the response using the sensor 414, it is thus possible to identify when the electrical resonator is resonating.

Control module 462 and identification module 464 may operate in conjunction to cause the apparatus to measure the resonance frequency of an electrical resonator-semiconductor device system, as described with reference to block 201 of FIG. 2.

Calculation module 466 determines a gate capacitance value for the semiconductor device based on the resonance frequency identified by module 464. As previously explained with reference to block 202 of FIG. 2, gate capacitance may be calculated from the resonance frequency.

Computer program code 460 may cause the apparatus to perform the method described with reference to FIG. 2.

The computer program code 460 further includes output generation module 468 for causing the processor to generate an output identifying the gate capacitance determined by module 466 is also provided.

Generating the output may comprise storing the gate capacitance value in the data storage 440, e.g. writing the gate capacitance value to a file. Generating the output may comprise displaying the gate capacitance on the display device of the user terminal. Generating the output may comprise piping the output to another process, e.g. in implementations where further values such as a measure of charge mobility are to be determined based on the gate capacitance.

The apparatus 400 may further comprise one or more additional components. The computer program code 460 may include additional modules for controlling the operation of such components.

For example, the apparatus 400 may be configured to measure the gate voltage which is applied to the semiconductor device. The apparatus may include a voltmeter, which is configured to be connectable to a gate electrode to measure the applied voltage e.g. via a pair of needle probes. The computer program code may include a gate voltage monitoring module, for monitoring the applied voltage based on an input from the voltmeter.

Alternatively or additionally, the apparatus 400 may be configured to control the gate voltage which is applied to the semiconductor device. The apparatus may comprise a variable voltage source for applying a gate voltage to the semiconductor device. The computer program code may comprise a gate voltage control module, for causing the processing unit to control the variable voltage source. The computer program code may be configured to cause the apparatus to measure gate capacitance at two or more different gate voltages. The computer program code may be configured to cause the gate voltage to vary and to monitor the response of the gate capacitance to variations in gate voltage.

Apparatus 400 may further include a unit for measuring conductance of the semiconductor device. This unit may be controlled by an appropriate computer program code module. The computer program code module may further comprise a module for determining, based on the conductance value and the gate capacitance value, charge mobility in the device.

One example of a unit for measuring conductance is a source measurement unit connectable to the source of the semiconductor device. In use, when measuring conductance using such a unit, the drain of the semiconductor device is connected to ground.

Another example of a unit for measuring conductance comprises current meter and either a voltage source or digital-to-analogue converter, DAC. The current meter is connectable to the drain of the semiconductor device. The voltage source or DAC is connectable to the source of the semiconductor device.

A still further example of a unit for measuring conductance comprises a lock-in amplifier and a current-to-voltage converter. The lock-in amplifier has an output connectable to the source of the semiconductor device, and an input connected to an output of the current-to-voltage converter. The current-to-voltage converter has an input which is connectable to the drain of the semiconductor device.

The computer program code may include a calculation module configured to calculate charge mobility, e.g. field effect mobility, based on the gate capacitance and conductance.

Figure 5:
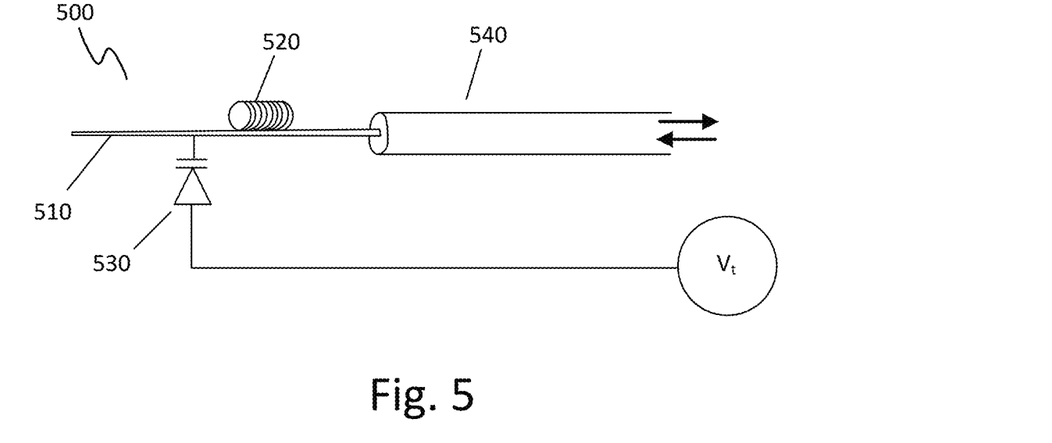
FIG. 5 is a schematic diagram of a probe of the present disclosure.

An example of a probe that may be used in combination with apparatus 400 will now be explained with reference to FIG. 5. FIG. 5 shows a schematic diagram of a resonator probe 500.

Resonator probe 500 includes a needle probe 510. A needle probe, also referred to as a mechanical probe, RF probe, or probe tip, is a conductive pin or shaft that may be brought into contact with an electrical component. In use, needle probe 510 acts as a low impedance contact 130 as described with reference to FIG. 1. Needle probe 510 thus desirably has as low an impedance as possible. Suitable probe tips are commercially available.

Resonator probe 500 further includes an inductor 520 and a capacitor 530 connected to the needle probe 510. Resonator probe 500 thus includes an LC circuit as described with reference to electrical resonator unit 120 of FIG. 1.

In this example, capacitor 530 is a variable capacitor, more specifically, a varactor. Varactors may also be referred to in the art as varicap diodes, variable capacitance diodes, variable reactance diodes, or tuning diodes. Varactor 530 is connected to a variable DC bias source, Vt. Although such a variable DC bias source is shown in FIG. 5, the variable voltage source does not necessarily form part of the probe, and the varactor 530 may be removably connected to the DC bias source Vt by appropriate wiring or transmission lines. Varying the DC bias source voltage causes the capacitance of varactor 530 to change, thereby changing the resonance frequency of the LC circuit. The LC circuit included in this example is thus a tuneable LC circuit.

The resonator probe 500 may be connectable to an IO unit, as previously described. In the illustrated example, the connection is via a coaxial cable 540. Coaxial cable 540 allows electrical signals to be sent to and from the needle probe 510. Any type of connection may be used.

In use, resonator probe 500 is used in conjunction with a passive needle probe. The passive needle probe may comprise, or be connected to, a resistor. The passive needle probe may act as a high impedance contact 150 as described with reference to FIG. 1. The resonator probe 500 is brought into electrical contact with one of the source, the gate, and the drain of the semiconductor device, e.g. touched on a source terminal of the semiconductor device, or an associated transmission line e.g. PCB trace. At the same time, the passive needle probe is brought into electrical contact with another terminal, which may be the source if the resonator probe connects to the drain or the gate, or may be the drain if the resonator probe connects to the source or the gate. This forms a circuit as illustrated in FIG. 1.

The resonator probe may be configured to allow a gate voltage to be applied via the resonator probe. Alternatively, the resonator probe may be used in conjunction with one or more further probe(s) for applying a voltage to the gate of the semiconductor device.

It will be appreciated that the above embodiments have been described by way of example only.

More generally, according to one aspect disclosed herein, there is provided a method of determining a gate capacitance of a semiconductor device having a source, a drain, a gate, and a channel, the semiconductor device being arranged in a circuit further comprising an electrical resonator, wherein one of the source, the drain, and the gate is connected to the electrical resonator; the method comprising: measuring a resonance frequency of the circuit; and calculating, based on the resonance frequency, the gate capacitance. Since the electrical resonator is in electrical communication with the source of the semiconductor device, the gate capacitance of the electrical resonator changes the resonance frequency of the electrical resonator. The gate capacitance may therefore be calculated based on the resonance frequency of the system.

The source, the drain, or the gate may be connected directly to the electrical resonator. In other words, there may be no components other than a connector such as a transmission line or probe between the electrical resonator and the source, drain or gate. The electrical resonator connects to exactly one of the source, the drain, and the gate.

Measuring the resonance frequency may comprise sending a probe signal having a frequency to the circuit, monitoring the amplitude and/or the phase of a response signal from the circuit, and identifying the resonance frequency based on a change of the amplitude and/or phase. A difference in phase between the response signal and the probe signal may be measured. In some circumstances, resonance may produce a small amplitude change but a large phase change or vice versa, therefore monitoring both amplitude and phase may be preferred.

Measuring the resonance frequency may include varying the frequency of the probe signal.

Alternatively or additionally, the electrical resonator may be a tuneable electrical resonator, and measuring the resonance frequency may include tuning the electrical resonator.

The frequency of the probe signal and/or the tuning of the electrical resonator may be varied during the measuring. Varying both the tuning of the electrical resonator and the frequency of the probe signal may allow for greater dynamic range than varying only one of the tuning and the frequency.

Still another example step for measuring the resonance frequency comprises may comprise sending a probe signal having a frequency to the circuit; measuring a difference in phase between the probe signal and a response signal received from the circuit; and calculating the resonance frequency based on the difference in phase. In such examples, the probe signal may have a fixed frequency and the electrical resonator may have a fixed tuning. This may allow for rapid determination of the resonance frequency.

The probe signal may have a frequency in the range 10 MHz to 10 GHz, for example, 1 GHz to 10 GHz. The probe signal frequency may be selected as desired based, for example, on the nature of the electrical resonator.

In implementations where the electrical resonator is an LC resonator, the probe signal typically has a frequency in the range 10 MHz to 2 GHz. For an LC resonator, probe signal frequencies in the range 100 MHz to 600 MHz, optionally 100 MHz to 500 MHz, further optionally 400 to 500 MHZ, may allow for improved performance in comparison with resonance frequencies above 650 MHz.

In implementations where the resonator is a transmission line resonator, the probe signal may have a frequency in the range 1 to 10 GHZ, for example.

Varying the frequency of the probe signal may comprise performing a scan. The scan may comprise varying the frequency of the probe signal in increments having a size in the range 0.01 and 1 MHz. The span of the scan, i.e., the width of the frequency range scanned, may be in the range 10 to 100 MHz. Calibrating the circuit may comprise scanning a frequency range with a larger span.

The nature of the semiconductor device is not particularly limited. The semiconductor device may, for example, comprise a semiconductor-superconductor hybrid device. Example 1 shows that the present method is applicable to such devices are presented herein. Other examples of semiconductor devices which may be investigated include field-effect transistors, such as MOSFETs.

Typically, the semiconductor device is not a quantum dot device. Gate capacitance is a type of 'classical', or geometrical, capacitance, and not a quantum capacitance. Measuring gate capacitance typically does not comprise measuring a readout of the state of a quantum bit.

In examples where the electrical resonator is connected to one of the source and the drain of the semiconductor device, the other of the source and the drain may be connected to a high impedance contact. In examples where the electrical resonator is connected to the gate of the semiconductor device, one or both of the source and drain may be connected to a respective high-impedance contact. The high-impedance contact(s) may minimise the flow of current from the source to the drain of the semiconductor device, thereby allowing for more precise measurement of the gate capacitance.

A high-impedance contact may be selected from a tunnel junction; a resistor having a resistance greater than or equal to 1 MΩ, optionally 10 MΩ; and a transistor, optionally a field-effect transistor, in an off state. In implementations where the high impedance contact comprises a transistor, the method comprises gating the transistor such that the transistor is in an off state during the measuring. The use of a transistor as the high-impedance contact may allow for easier measurement of the conductance of the channel of the semiconductor device.

The method may include applying a gate voltage to the gate, and identifying the resonance frequency of the circuit while applying the gate voltage. The method may comprise measuring two or more gate capacitances at two or more different gate voltages.

The method may include calibrating the circuit by applying a gate voltage selected such that the channel of the semiconductor device is non-conductive, and identifying the resonance frequency of the circuit while applying the gate voltage. Gate capacitance may be assumed to be zero when the channel is non-conductive.

The gate voltage for calibrating the circuit may be identified from conductance measurements. Alternatively, resonance frequency may be measured at a plurality of different gate voltages to identify a maximum resonance frequency. Gate capacitance may be assumed to be 0 when the resonance frequency is at a maximum.

The gate voltage may be varied as a function of time during the identifying. For example, the gate voltage may be cyclically varied. Providing a gate voltage which changes with time may allow the performance of a gate dielectric arranged between the gate and the channel to be investigated. Charge trapping by the gate dielectric may cause the gate capacitance to vary.

The calculating may be performed by a computer comprising a processing unit operably linked to a data storage, the data storage containing computer program code instructions configured to cause the processor to calculate a value of the gate capacitance based on the resonance frequency.

The method may further comprise measuring a conductance of the semiconductor device. In such implementations, the method may further comprise calculating, based on the gate capacitance and the conductance, charge mobility in the semiconductor device. The charge mobility may be a field-effect charge mobility.

Measuring conductance generally comprises applying a DC voltage across the source and drain of the semiconductor device, and measuring current through the channel of the semiconductor device. Electrical resonators typically have a low resistance, and conductance may be measured when the semiconductor device is in series with the electrical resonator.

In implementations where the high impedance contact is a transistor in an off state, conductance may be measured when the transistor is in an on state.

The method may further comprise performing a further measurement of gate capacitance of the semiconductor device, wherein the further measurement is selected from a capacitance bridge measurement, a coulomb blockade measurement, and a capacitance-voltage measurement. The further measurement may be performed before measuring the gate capacitance using the method of the present disclosure, in order to obtain an estimate of the gate capacitance. This may allow for, for example, optimization of the range of probe signal frequencies to allow for faster measurement of gate capacitance using the more precise method provided herein.

The electrical resonator may be removably connected to the semiconductor device. The method may include, after identifying the resonance frequency, disconnecting the electrical resonator from the semiconductor device.

In implementations where the electrical resonator is removably connected to the semiconductor device, the method may further comprise identifying the resonance frequency of the electrical resonator before arranging the electrical resonator in the circuit.

The electrical resonator may be permanently connected to the semiconductor device. For example, the electrical resonator may be integrated onto the same chip as the semiconductor device, or connected to the semiconductor device by wire bonding.

The nature of the electrical resonator is not particularly limited and may be selected as appropriate. The electrical resonator may be a superconductor resonator. More generally, the circuit may comprise superconductor components, normal-conductor components, or any combination of superconductors and normal conductors.

The electrical resonator may be an LC circuit comprising an inductor and a capacitance. For an LC circuit, resonance frequency may vary approximately linearly with gate capacitance.

The inductor may comprise a coil.

The capacitance of the LC circuit may be a parasitic capacitance. Alternatively, the capacitance may be provided by a capacitor. The capacitor may be a variable capacitor, such as a varactor.

The electrical resonator may be a tuneable electrical resonator. An LC circuit which includes a variable capacitor is one example of a tuneable electrical resonator.

Another illustrative type of electrical resonator is a transmission line resonator. The principles explained herein are also applicable to transmission line resonators.

In another aspect, there is provided an apparatus for measuring a gate capacitance of a semiconductor device, the semiconductor device having a having a source, a drain, a gate, and a channel; which apparatus comprises: a signal generator capable of providing a probe signal to an electrical resonator; a sensor capable of sensing the amplitude and/or phase of a response signal from the electrical resonator; a processing unit operably linked to the signal generator and the sensor; and a memory unit operably linked to the processing unit, wherein the memory unit stores computer program code, the computer program code being executable by the processing unit; wherein the computer program code comprises: a control module for causing the processing unit to control the signal generator; an identification module for causing the processing unit to identify, based on an input from the sensor, a resonance frequency of a circuit comprising the electrical resonator; a calculation module for causing the processing unit to calculate, based on the resonance frequency, the gate capacitance of the semiconductor device; and an output generation module for generating an output identifying the gate capacitance. The apparatus may be useful for practising the method described herein.

The circuit may comprise the electrical resonator connected to one of the source, the gate, and the drain of the semiconductor device.

The apparatus may further include the electrical resonator. In such implementations, the electrical resonator may be connectable to a semiconductor device. Alternatively, the apparatus may be removably connectable to the electrical resonator. For example, the apparatus may be configured to connect to an electrical resonator which is permanently connected to the semiconductor device.

The electrical resonator may be as described above with reference to the method aspect. The electrical resonator may be a superconductor resonator.

The electrical resonator may be an LC circuit. The capacitance of the LC circuit may be a parasitic capacitance, or may be provided by a capacitor such as a variable capacitor.

The control module and identification module may be configured to cause the apparatus to identify the resonance frequency of the electrical resonator, by sending a probe signal to the resonator using the signal generator, monitoring the amplitude of a response signal from the electrical resonator using the sensor, and identifying when the amplitude is a maximum amplitude. One or more of the frequency of the probe signal, the tuning of the electrical resonator, and the gate voltage may be varied in order to obtain the maximum amplitude, as previously described with reference to the method aspect.

The calculation module may calculate the gate capacitance based on the identified resonance frequency, e.g. using the principles explained with reference to FIG. 1.

The output generation module may be configured to generate any appropriate form of output. The output may comprise storing data encoding the gate capacitance in the data storage, generating a graphical representation (e.g., text or a graph) for display to a human user, and/or piping the gate capacitance value to a further computer program.

A module may be any portion computer program code configured to cause the processing unit to perform the relevant function.

The apparatus may include a DC bias source for applying a gate voltage to the gate of the semiconductor device. The DC bias source may be a variable DC source. In implementations where the apparatus includes a DC bias source, the computer program code may further comprise a gate voltage control module for causing the processing unit to control the DC bias source to apply a gate voltage to the gate. The computer program code may be configured to cause the apparatus to measure gate capacitance at two or more different gate voltages, or to vary gate voltage during measurements, as previously described with reference to the method aspect.

Alternatively or additionally, the apparatus may include a voltage sensor for sensing a gate voltage. The computer program code may include a voltage sensor monitoring module, for causing the processing unit to identify a gate voltage using the voltage sensor.

In implementations where the apparatus includes, or is configured to connect to, a tuneable electrical resonator, the apparatus may further comprise hardware for tuning the electrical resonator along with computer program code for controlling operation of that hardware. For example, if the tuneable electrical resonator comprises a varactor, the apparatus may include a DC bias source for applying a bias voltage to the varactor.

The apparatus may further comprise a unit for measuring conductance of the semiconductor device.

One example of a unit for measuring conductance is a source measurement unit connectable to the source of the semiconductor device. In use, when measuring conductance using such a unit, the drain of the semiconductor device is connected to ground.

Another example of a unit for measuring conductance comprises current meter and either a voltage source or digital-to-analogue converter, DAC. The current meter is connectable to the drain of the semiconductor device. The voltage source or DAC is connectable to the source of the semiconductor device.

A still further example of a unit for measuring conductance comprises a lock-in amplifier and a current-to-voltage converter. The lock-in amplifier has an output connectable to the source of the semiconductor device, and an input connected to an output of the current-to-voltage converter. The current-to-voltage converter has an input which is connectable to the drain of the semiconductor device.

The unit for measuring conductance unit may be controlled by an appropriate computer program code module. The computer program code may further comprise a module for determining, based on the conductance value and the gate capacitance value, charge mobility in the device.

The apparatus may comprise a mechanical probe station, further comprising first and second needle probes. The first needle probe may be a resonator probe, and the second needle probe may be a passive needle probe. Alternatively, both the first needle probe and the second needle probe may be passive needle probes.

A related aspect provides a probe for measuring a gate capacitance. The probe is configured to be connectable to an apparatus, such as the apparatus as described with reference to the previous aspect, to receive a probe signal from the apparatus and to provide a response signal from the LC circuit to the apparatus.

The probe may comprise a needle probe, an inductor, and a capacitor. The needle probe, inductor, and capacitor are configured as an LC circuit. A probe comprising an LC circuit is referred to herein as a resonator probe.

The capacitor may be a varactor. In implementations where a varactor is used, the LC circuit is tuneable by applying a DC bias to the varactor thereby varying its capacitance and hence, the resonance frequency of the LC circuit.

The resonator probe may be used in combination with a high-impedance probe. The high-impedance probe may comprise a needle probe and a resistor having a resistance of greater than or equal to 1 MΩ, e.g. greater than or equal to 10 MΩ.

Alternatively, the resonator probe may be used in combination with a variable-impedance probe comprising a needle probe and a transistor. In use, the transistor is gated to an "off" state during measurement of gate capacitance. The variable impedance probe may also be used to measure conductance, by gating the transistor to an "on" state.

A further related aspect provides a use of the above-described probe in the measurement of a gate capacitance of a semiconductor device, the semiconductor device having a having a source, a drain, a gate, and a channel.

Another aspect provides a computer program product comprising computer program code which, when executed by a processor, causes the processor to: process an input to identify a resonance frequency of a circuit comprising an electrical resonator; calculate, based on the resonance frequency, a gate capacitance; and generate an output identifying the gate capacitance. The computer program product may be embodied on a non-transitory computer readable medium. A related aspect provides a computer readable storage medium having stored thereon the computer program product.

The circuit may comprise the electrical resonator connected to one of the source, the gate, and the drain of the semiconductor device.

The input may be received from a sensor, read from a data storage, received over a network, received from another computer program, or entered by a user.

Calculating the gate capacitance from the resonance frequency may comprise applying the principles described hereinabove.

The output may comprise storing data encoding the gate capacitance in the data storage, generating a graphical representation (e.g., text or a graph) for display to a human user, and/or piping the gate capacitance value to a further computer program.

The computer program may comprise the computer program code described with reference to the apparatus aspect.

Example 1

Figure 6:
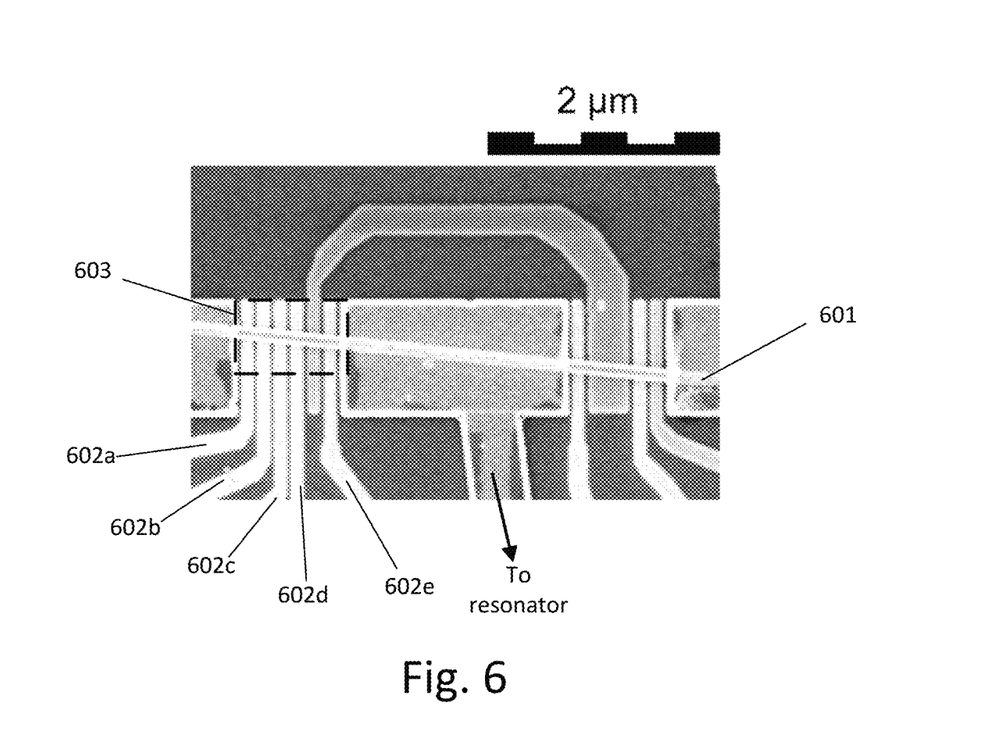
FIG. 6 is an annotated scanning electron microscopy, SEM, micrograph of a semiconductor-superconductor hybrid device having a plurality of finger gates, investigated in Example 1.

In order to demonstrate that the gate capacitance of a semiconductor hybrid device may be measured using the method of the present disclosure, measurements were performed on an illustrative device. A scanning electron microscopy, SEM, micrograph of the device is shown in FIG. 6.

The illustrative device includes a nanowire 601 of semiconductor material which is gated by a set of finger gates 602a to 602e. Gate capacitance is formed in the region 603 when an electrostatic field is applied to the nanowire 601 using one or more of the finger gates 602a to 602e. The area of the nanowire 601 which was in contact with each of the finger gates 602a to 602e had dimensions of approximately 80 nm×100 nm.

In order to measure the gate capacitance, a contact pad of the device was connected to an LC resonator. The resonance frequency of the LC resonator was measured with a varying number of active finger gates. The results of this investigation are shown in a FIG. 7.

Figure 7:
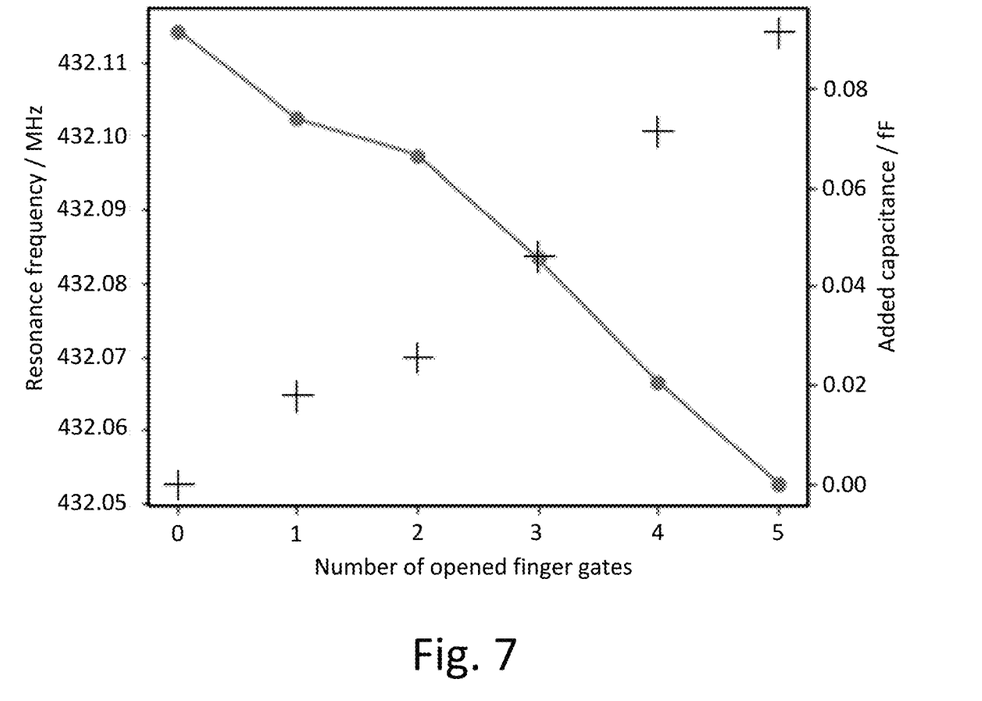
FIG. 7 is a plot showing: (a) the resonance frequency of the resonator used in Example 1 (• symbols, left-hand axis), and (b) calculated additional gate capacitance of the FIG. 6 device (+ symbols, right-hand axis), each as a function of the number of active finger gates.

As may be seen from FIG. 7, changes in gate capacitance as a result of opening the finger gates were detected as changes in the resonance frequency of the LC circuit. As is shown in FIG. 7, changes in the capacitance were of the order of 10 attofarads, and differences of this size were easily measurable. The inventors believe that a sensitivity of 1 attofarad is achievable using the present method.

Example 2

Figure 8:
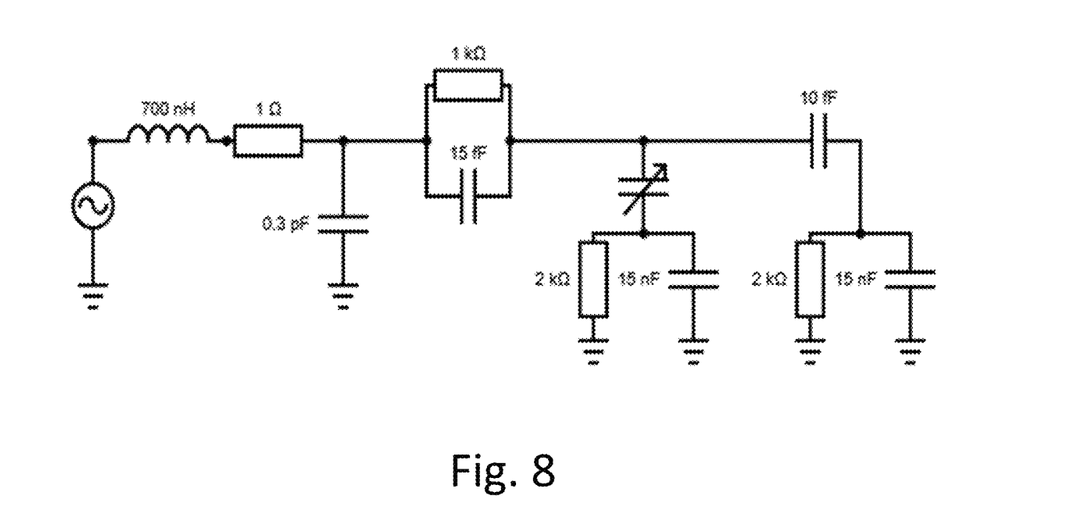
FIG. 8 is a diagram of a circuit which was simulated in Example 2.

Simulations were performed to estimate the accuracy of the method provided herein. The simulated system is illustrated in FIG. 8. Capacitance, resistance and inductance values used for the simulation were based on the test device discussed in Example 1 and are thus believed to reflect real-world conditions.

Figure 9:
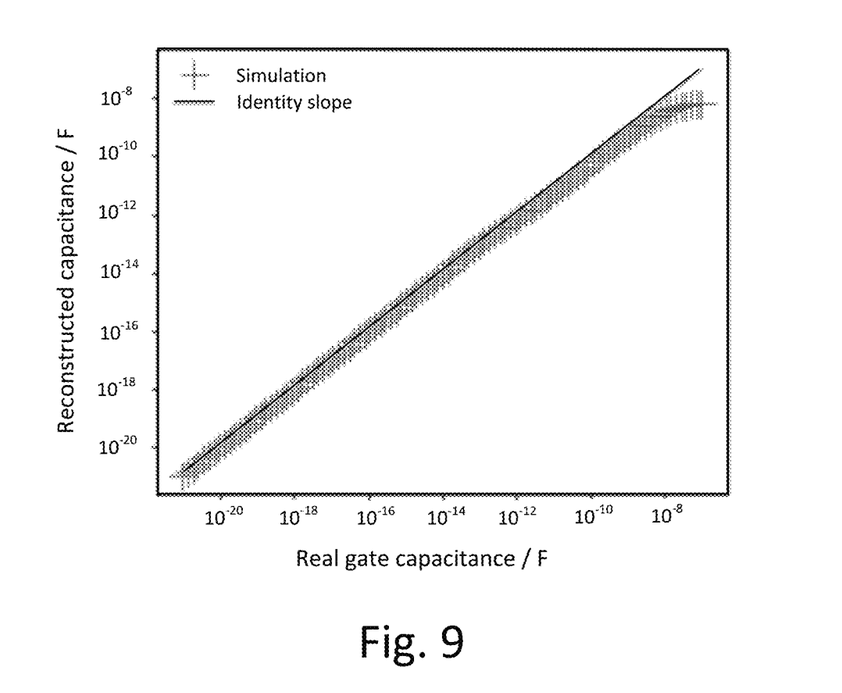
FIG. 9 is a plot comparing gate capacitance calculated from a resonance frequency against the input gate capacitance in the simulations of Example 2.

Capacitance values were calculated on the basis of resonance frequency, and plotted against the true gate capacitance of the simulated system. The result of this are shown in FIG. 9.

As may be seen from the figure, very good agreement between the reconstructed capacitance and the true capacitance was obtained. Systematic errors were estimated to be less than 1%.

Figure 10:
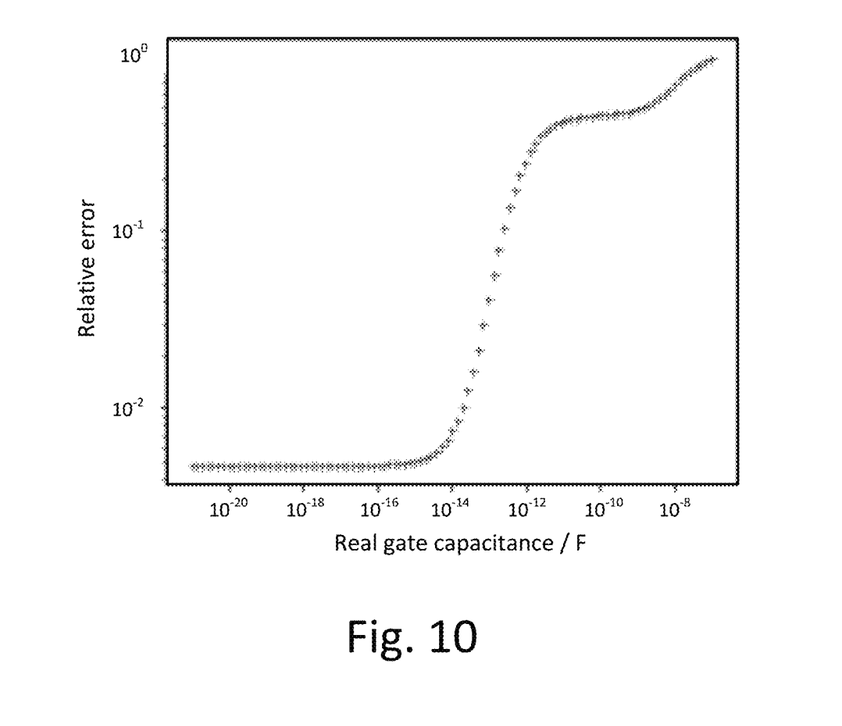
FIG. 10 is a plot of relative error against input gate capacitance, derived from the data of FIG. 9.

A corresponding plot of relative error between the reconstructed and true values against the true capacitance is provided in FIG. 10. For values in the femtofarad range or smaller, relative errors were very small. Gate capacitances in the devices of interest generally fall within this range.

Other variants or use cases of the disclosed techniques may become apparent to the person skilled in the art once given the disclosure herein. The scope of the disclosure is not limited by the described embodiments but only by the accompanying claims.

The invention claimed is:

1. A method of determining a gate capacitance of a semiconductor device having a source, a drain, a gate, and a channel,
the semiconductor device being arranged in a circuit further comprising an electrical resonator, wherein one of the source and the drain is connected to the electrical resonator, and the other of the source and the drain is connected to a high-impedance contact, the high-impedance contact being selected from a tunnel junction, a resistor having a resistance greater than or equal to 1 MΩ, and a transistor in an off state;
the method comprising:
measuring a resonance frequency of the circuit based on tuning of the electrical resonator and a probe signal having a frequency sent to the circuit, wherein measuring the resonance frequency includes varying both the frequency of the probe signal and the tuning of the electrical resonator; and
calculating, based on the resonance frequency, the gate capacitance.

2. The method according to claim 1, wherein measuring the resonance frequency comprises sending the probe signal having a frequency to the circuit, monitoring at least one parameter selected from the amplitude and phase of a response signal from the circuit, and identifying a change of the at least one parameter.

3. The method according to claim 2, wherein the probe signal has a frequency in the range 10 MHz to 10 GHz.

4. The method according to claim 1, including applying a gate voltage to the gate, and measuring the resonance frequency of the circuit while applying the gate voltage.

5. The method according to claim 4, wherein the method comprises determining a gate capacitance at two or more different gate voltages.

6. The method according to claim 4, further comprising varying the gate voltage during the measuring.

7. The method according to claim 1, further comprising measuring a conductance of the semiconductor device.

8. The method according to claim 1, further comprising performing an additional measurement of gate capacitance of the semiconductor device, wherein the additional measurement is selected from a capacitance bridge measurement, a coulomb blockade measurement, and a capacitance-voltage measurement.

9. The method according to claim 1, wherein
the electrical resonator is an LC circuit comprising an inductor and a capacitance; and
the capacitance is a parasitic capacitance, or wherein the capacitance is provided by a varactor.

10. The method according to claim 1, wherein the electrical resonator is a transmission line resonator.

11. The method according to claim 1, wherein the electrical resonator is connected to the gate.

12. The method according to claim 1, wherein measuring the resonance frequency comprises sending the probe signal having a frequency to the circuit; measuring a phase difference between the probe signal and a response signal received from the circuit; and calculating the resonance frequency based on the phase difference.

13. An apparatus for determining a gate capacitance of a semiconductor device, the semiconductor device having a having a source, a drain, a gate, and a channel; the apparatus comprising:
an electrical resonator connected to one of the source and the drain of the semiconductor device;
a high impedance contact connected to the other of the source and the drain of the semiconductor device;
a signal generator capable of providing a probe signal to the electrical resonator;
a sensor capable of sensing at least one of amplitude and phase of a response signal from the electrical resonator;
a processing unit operably linked to the signal generator and the sensor; and
a memory unit operably linked to the processing unit, wherein the memory unit stores computer program code, the computer program code being executable by the processing unit;
wherein the computer program code comprises:
a control module configured to cause the processing unit to control the signal generator;
an identification module configured to cause the processing unit to identify, based on an input from the sensor, a resonance frequency of the electrical resonator, the processing unit identifying the resonance frequency based on tuning of the electrical resonator and the probe signal having a frequency sent to the electrical resonator, wherein identifying the resonance frequency includes varying both the frequency of the probe signal and the tuning of the electrical resonator;

a calculation module configured to cause the processing unit to calculate, based on the resonance frequency, the gate capacitance of the semiconductor device; and an output generation module configured to generate an output identifying the gate capacitance.

14. The apparatus according to claim 13, wherein the electrical resonator is an LC circuit comprising an inductor and a capacitance.

15. The apparatus according to claim 13, wherein the LC circuit includes a varactor.

16. The apparatus according to claim 13, further comprising a first probe configured to be connected to the source of the semiconductor device, and a second probe configured to be connected to the drain of the semiconductor device.

17. The apparatus according to claim 13, further comprising a unit for measuring conductance of the semiconductor device.

18. A computer program product embodied on a non-transitory computer readable medium, comprising computer program code which, when executed by a processor, causes the processor to:

process an input to identify a resonance frequency of a circuit comprising an electrical resonator based on tuning of the electrical resonator and a probe signal having a frequency sent to the circuit, wherein identifying the resonance frequency includes varying both the frequency of the probe signal and the tuning of the electrical resonator;

calculate, based on the resonance frequency, a gate capacitance; and generate an output identifying the gate capacitance.

* * * * *